(12) United States Patent
Kanai et al.

(10) Patent No.: US 11,610,826 B2
(45) Date of Patent: Mar. 21, 2023

(54) SEMICONDUCTOR MODULE

(71) Applicant: FUJI ELECTRIC CO., LTD., Kawasaki (JP)

(72) Inventors: Naoyuki Kanai, Kawasaki (JP); Yuichiro Hinata, Kawasaki (JP); Yuta Tamai, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 94 days.

(21) Appl. No.: 17/363,628

(22) Filed: Jun. 30, 2021

(65) Prior Publication Data
US 2022/0068733 A1 Mar. 3, 2022

(30) Foreign Application Priority Data
Aug. 27, 2020 (JP) .............................. JP2020-143405

(51) Int. Cl.
*H01L 23/00* (2006.01)
*H01L 23/055* (2006.01)
*H01L 23/31* (2006.01)

(52) U.S. Cl.
CPC ........ *H01L 23/055* (2013.01); *H01L 23/3121* (2013.01); *H01L 24/48* (2013.01); *H01L 2224/48175* (2013.01)

(58) Field of Classification Search
CPC ... H01L 23/055; H01L 23/3121; H01L 24/48; H01L 2224/48175; H01L 24/29; H01L 24/49; H01L 25/072; H01L 23/562; H01L 24/32; H01L 24/45; H01L 24/73; H01L 24/83; H01L 2224/29111; H01L 2224/29339; H01L 2224/29344; H01L 2224/29347; H01L 2224/32225; H01L 2224/45014; H01L 2224/45015; H01L 2224/45124; H01L 2224/45144; H01L 2224/45147; H01L 2224/48091; H01L 2224/48227; H01L 2224/48471; H01L 2224/49175; H01L 2224/73265; H01L 2224/83801; H01L 2224/8384; H01L 2924/13055; H01L 2924/13091;
(Continued)

(56) References Cited

U.S. PATENT DOCUMENTS

2015/0371931 A1  12/2015  Nishida et al.
2020/0286840 A1   9/2020  Kaji et al.

FOREIGN PATENT DOCUMENTS

JP    2002-299551 A    10/2002
JP    2015-162649 A     9/2015
(Continued)

*Primary Examiner* — Elias Ullah
(74) *Attorney, Agent, or Firm* — Rabin & Berdo, P.C.

(57) ABSTRACT

A semiconductor module is provided with: a case having a frame that surrounds a substrate and a terminal block formed extending inward from an inner wall surface of the frame; a terminal having one end extending outward from the frame, and another end extending inward from the frame and being secured to a top face of the terminal block; a wiring member that electrically connects the terminal and a semiconductor element on the substrate; and an encapsulating resin that encapsulates the other end of the terminal, the wiring member, and the semiconductor element inside the case. A hole is formed in the top face of the terminal block. The hole is filled with the encapsulating resin, and is positioned closer to the inner wall surface of the frame than a bonding part between the terminal and the wiring member.

20 Claims, 9 Drawing Sheets

(58) Field of Classification Search
CPC ..... H01L 2924/181; H01L 2924/19107; H01L 23/053; H01L 23/3142; H01L 23/24; H01L 23/10; H01L 23/13
See application file for complete search history.

(56) References Cited

FOREIGN PATENT DOCUMENTS

| | | |
|---|---|---|
| JP | 2017-152472 A | 8/2017 |
| WO | 2014/199764 A1 | 12/2014 |
| WO | 2019/008828 A1 | 1/2019 | ized.
SEMICONDUCTOR MODULE

CROSS REFERENCE TO RELATED APPLICATIONS

This application is based upon and claims the benefit of priority of the prior Japanese Patent Application No. 2020-143405, filed on Aug. 27, 2020, the entire contents of which are incorporated herein by reference.

BACKGROUND OF THE INVENTION

Field of the Invention

The present invention relates to a semiconductor module.

Description of the Related Art

Semiconductor modules have a substrate on which semiconductor elements such as an insulated-gate bipolar transistor (IGBT), a power metal-oxide-semiconductor field-effect transistor (power MOSFET), and a free-wheeling diode (FWD) are provided, and are used in apparatuses such as inverters. A specific configuration of a semiconductor module of this type is described in Japanese Patent Laid-Open No. 2017-152472, for example.

In the semiconductor module described in Japanese Patent Laid-Open No. 2017-152472, a terminal block is formed inside a case. Terminals secured onto the terminal block are electrically connected to semiconductor elements on a substrate by wiring members (wires, for example). In the semiconductor module according to Japanese Patent Laid-Open No. 2017-152472, components such as the substrate, the terminals, and the wiring members are protected by being encapsulated inside the case by an encapsulating resin.

SUMMARY OF THE INVENTION

In such a configuration, if a heat cycle test is performed for example, the encapsulating resin may peel away from the case due to thermal stress. If the peeling of the encapsulating resin progresses as far as the terminal block and a load is imposed on the bonding part between the wiring members and the terminals, the bonding part may peel away from the terminals or the wiring members may break, and defects may occur in which the terminals and the semiconductor elements on the substrate become electrically disconnected.

An object of the present invention, which has been made in light of such circumstances, is to provide a semiconductor module capable of reducing the occurrence of defects in which the electrical connections between the terminals and the semiconductor elements on the substrate are disconnected due to peeling of the encapsulating resin.

A semiconductor module according to an embodiment of the present invention is provided with: a case having a frame that surrounds a substrate and a terminal block formed extending inward from an inner wall surface of the frame; a terminal having one end extending outward from the frame and another end extending inward from the frame and secured to a top face of the terminal block; a wiring member that electrically connects the terminal and a semiconductor element on the substrate; and an encapsulating resin that encapsulates the other end of the terminal, the wiring member, and the semiconductor element inside the case. A hole is formed in the top face of the terminal block, and the hole is filled with the encapsulating resin, and is positioned closer to the inner wall surface of the frame than a bonding part between the terminal and the wiring member.

Also, a semiconductor module according to an embodiment of the present invention is provided with: a case having a frame that surrounds a substrate and a terminal block formed extending inward from an inner wall surface of the frame; a terminal having one end extending outward from the frame and another end extending inward from the frame and secured to a top face of the terminal block; a wiring member that electrically connects the terminal and a semiconductor element on the substrate; an encapsulating resin that encapsulates the other end of the terminal, the wiring member, and the semiconductor element inside the case, and an adhesive part that sticks the frame to a base with an adhesive. A hole is formed in the terminal block so as to penetrate from a first surface of the terminal block in contact with the encapsulating resin to a second surface of the terminal block in contact with the adhesive part. The hole has one opening in the first surface, has an opposite opening in the second surface, and is filled with the encapsulating resin from the one opening and is filled with the adhesive from the opposite opening.

According to the present invention, in a semiconductor module, it is possible to reduce the occurrence of defects in which the electrical connections between the terminals and the semiconductor elements on the substrate are disconnected due to peeling of the encapsulating resin.

DETAILED DESCRIPTION OF THE PREFERRED EMBODIMENTS

Hereinafter, a semiconductor module to which the present invention is applicable will be described. Note that in the following description, common or corresponding elements are denoted with the same or similar signs, and duplicate description is omitted.

First Embodiment

Figure 1:
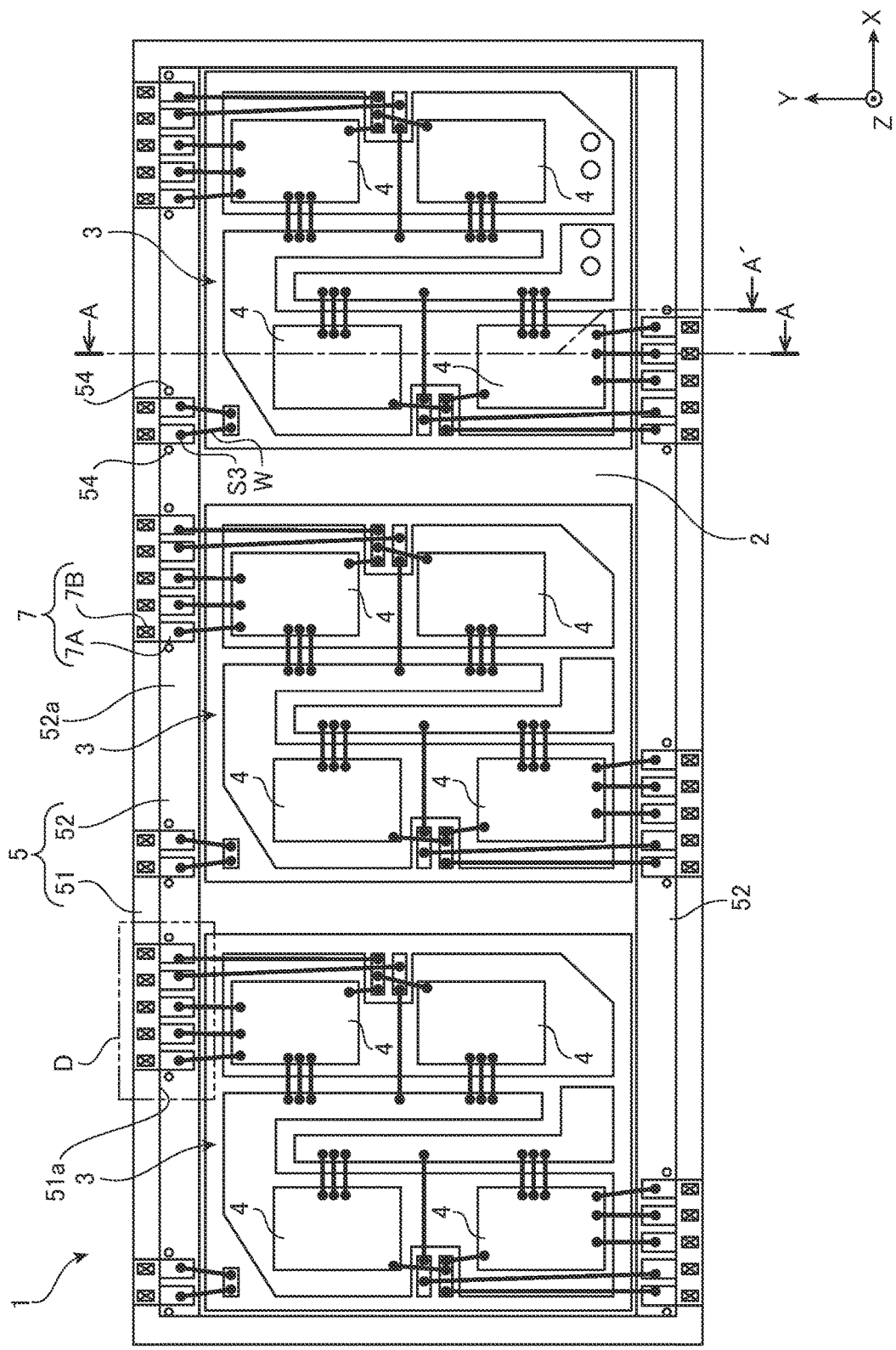
FIG. 1 is a plan view schematically illustrating a semiconductor module according to a first embodiment of the present invention.
Figure 2:
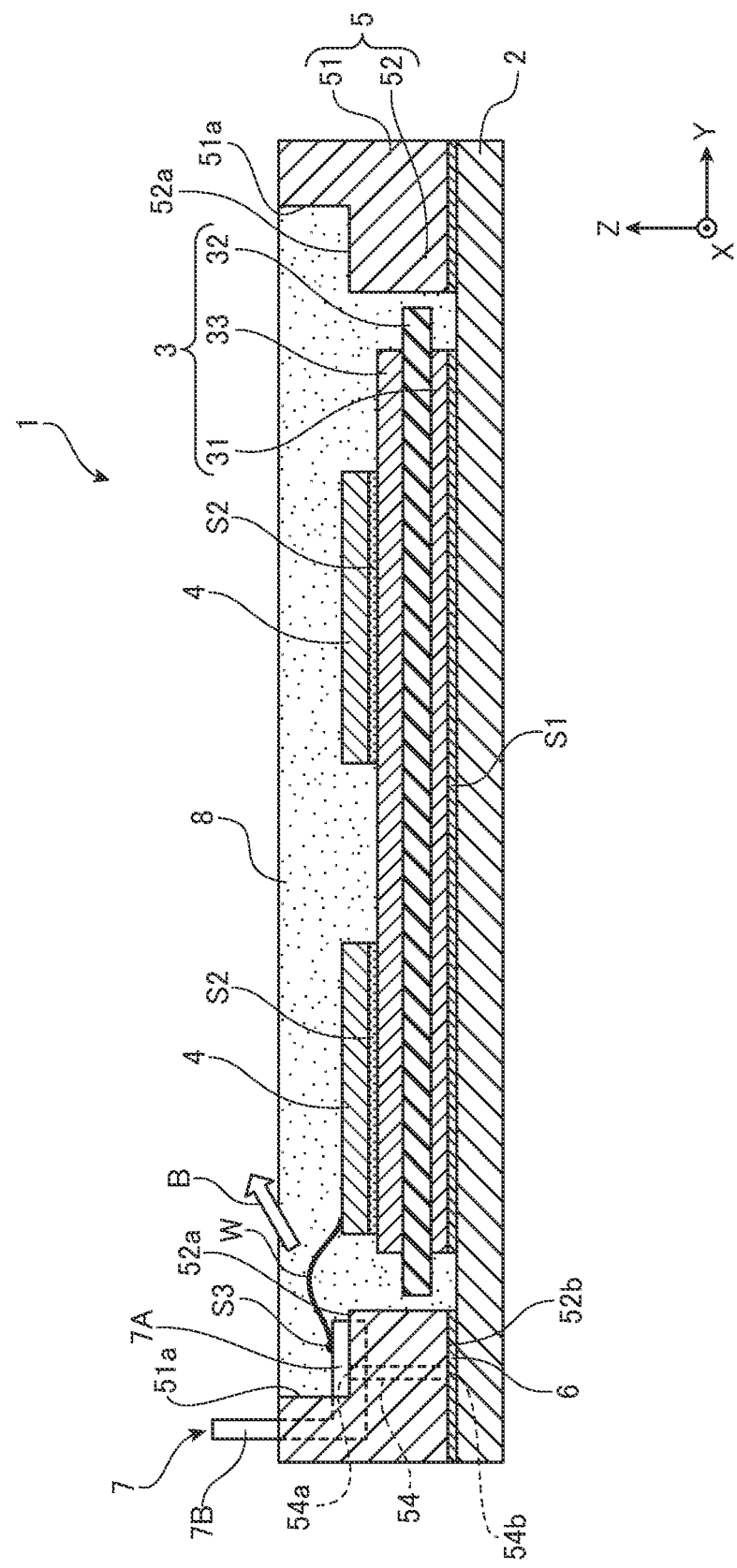
FIG. 2 is a diagram illustrating an internal structure of the semiconductor module according to the first embodiment of the present invention.
Figure 3:
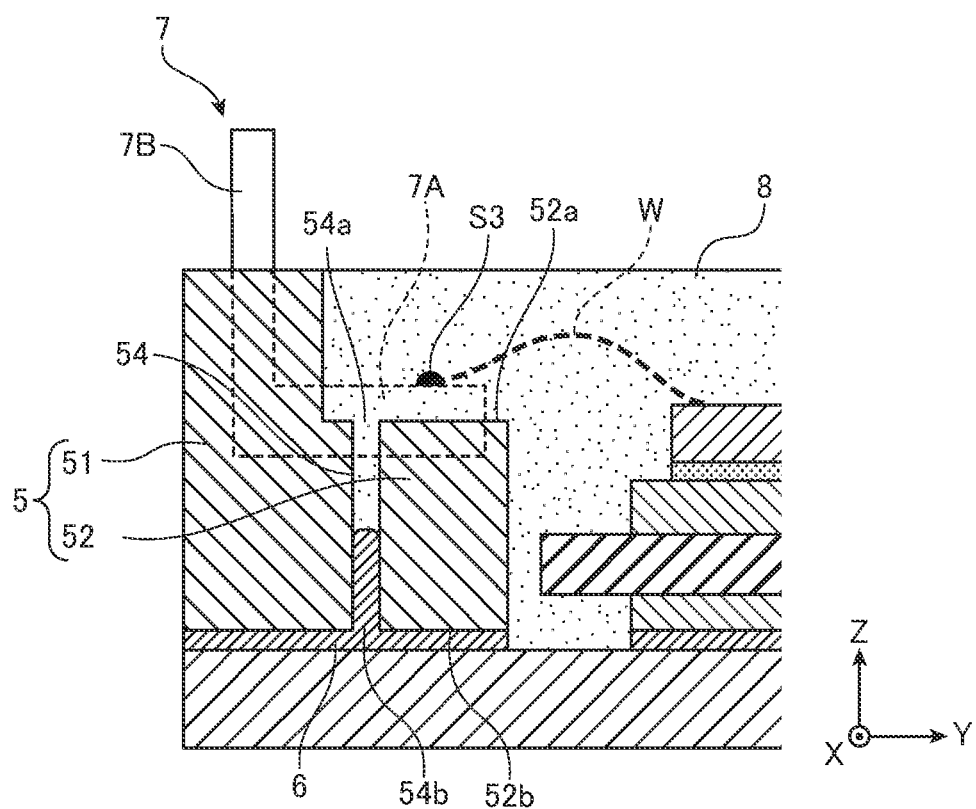
FIG. 3 is a diagram illustrating an internal structure of the semiconductor module according to the first embodiment of the present invention.
Figure 4:
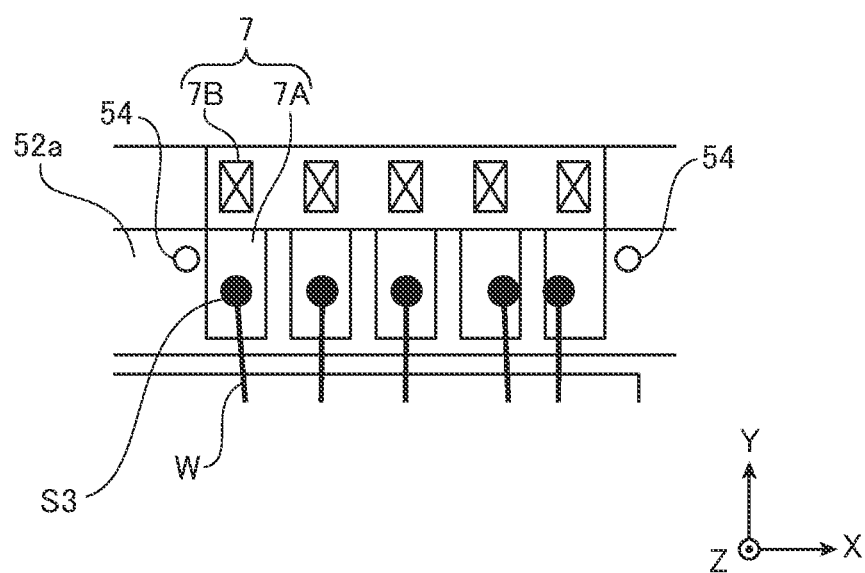
FIG. 4 is a diagram illustrating an internal structure of the semiconductor module according to the first embodiment of the present invention.

FIG. 1 is a plan view schematically illustrating a semiconductor module 1 according to a first embodiment of the present invention. FIG. 2 is a cross section view taken along the line A-A in FIG. 1, illustrating an Internal structure of the semiconductor module 1. FIG. 3 is a cross section view taken along the line A-A' in FIG. 1, illustrating an internal structure of the semiconductor module 1. FIG. 4 is an enlarged view of the portion indicated by the sign D in FIG. 1. Note that in FIG. 3, only the cross section along the line diverging from the line A-A is illustrated for convenience. The semiconductor module 1 illustrated hereinafter is merely one example, and a semiconductor module according to the present invention is not limited thereto and may be modified appropriately.

In the following description, the longitudinal direction, the lateral direction, and the height direction of the semiconductor module 1 are designated the X direction, the Y direction, and the Z direction, respectively. The X direction, the Y direction, and the Z direction are orthogonal to each other. Also, for convenience of explanation, the side indicated by the arrowhead of the Z direction is also referred to as the upper or top side, while the opposite side is also referred to as the lower or bottom side. Note that the names of these directions are names of convenience used to explain the relative positional relationships of components, and do not refer to absolute directions. For example, the Z direction (top and bottom direction) is not necessarily limited to the vertical direction, and may also be the horizontal direction for example. Also, in this specification, a plan view means the case of viewing the top face of the semiconductor module 1 from the side indicated by the arrowhead of the Z direction.

Also, in each diagram, not necessarily all elements are denoted with signs. Specifically, in the case where the same elements are illustrated multiple times in a single diagram, only a representative portion of the same elements are denoted with a sign, and the sign may be omitted from the remaining elements. For example, in FIG. 1, a subset of terminals 7 among a plurality of terminals 7 are denoted with the sign 7, but the sign 7 is omitted from the remaining terminals 7.

The semiconductor module 1 is applied to a power conversion device such as a power module, for example. The semiconductor module 1 according to the first embodiment of the present invention is a power module forming an inverter circuit. As illustrated in FIG. 2, the semiconductor module 1 is provided with a base plate 2, a plurality of multilayer substrates 3 arranged on top of the base plate 2, a plurality of semiconductor elements 4 disposed on top of the multilayer substrates 3, and a case 5 that surrounds and houses the plurality of multilayer substrates 3 and the plurality of semiconductor elements 4.

The base plate 2 is a heatsink having a rectangular shape in a plan view that is long in the X direction, and acts as a heatsink that transfers heat from the multilayer substrates 3 and electronic components mounted on the multilayer substrates 3 to the outside. Also, the base plate 2 is formed covering the case 5 from the back face. The base plate 2 has high thermal conductivity, and is formed using a material that resists warping even when a heat treatment such as soldering is applied. The base plate 2 is a metal plate containing aluminum, copper, an aluminum alloy, or a copper alloy for example, and the surface may also be subjected to Ni plating to prevent corrosion and the like. Additionally, the base plate 2 may also be a metal composite plate formed using a composite material of aluminum and silicon carbide, or magnesium and silicon carbide. The base plate 2 may also be provided with heat-dissipating structures such as cooling fins. In this case, the base plate 2 is formed using aluminum, for instance.

The multilayer substrates 3 are arranged on the top face of the base plate 2 so as to be surrounded by the case 5. In the first embodiment, three multilayer substrates 3 forming each phase of the U, V, and W phases of an inverter circuit are arranged side by side in the X direction.

The multilayer substrates 3 are formed by stacking metal layers and insulating layers. Specifically, for example, the multilayer substrates 3 are direct bonded aluminum (DBA) substrates, direct copper bonding (DCB) substrates, or active metal brazing (AMB) substrates, in which a metal plate 31, an insulating plate 32, and a circuit pattern 33 are stacked in order from the base plate 2 side.

The insulating plate 32 is formed using a material with excellent insulation properties and thermal conductivity. Specifically, the insulating plate 32 is formed by a ceramic material such as alumina, aluminum nitride, or silicon nitride, a resin material such as epoxy, or an insulating material such as an epoxy resin using a ceramic material as a filler, for example. The insulating plate 32 may also be referred to as an insulating layer or an insulating film.

The metal plate 31 is formed on the bottom face of the insulating plate 32. The metal plate 31 may be formed covering a region that excludes the peripheral edges of the bottom face of the insulating plate 32. The metal plate 31 is formed using copper, aluminum, or an alloy thereof, for example. Furthermore, the surface may also be subjected to Ni plating to prevent corrosion and the like. The metal plate 31 is bonded to the top face of the base plate 2 through a bonding material S1. The bonding material S1 is formed using lead-free solder such as SnAgCu, SnSb, SnSbAg, SnCu, SnSbAgCu, SnCuNi, or SnAg solder, for example. The bonding material S1 may also be lead solder.

The circuit pattern 33 is formed plurally on the top face of the insulating plate 32. The circuit patterns 33 are formed as islands electrically insulated from each other in a region that excludes the peripheral edges of the bottom face of the insulating plate 32. Each circuit pattern 33 is formed using the same material as the metal plate 31, for example. Note that the numbers and shapes of the circuit patterns 33 illustrated in FIG. 1 are merely one example, and the circuit patterns 33 are not limited thereto and may be modified appropriately.

The semiconductor elements 4 are disposed at predetermined locations on the top faces of the circuit patterns 33 through a bonding material S2. The bonding material S2 is formed using the same material as the bonding material S1, for example. The bonding material S2 may also be a sintered material such as gold, silver, or copper. In this way, electrodes on the back surface of the semiconductor elements 4 described later are electrically connected to the circuit patterns 33. Also, one end of wires W that act as wiring members described later are connected to predetermined locations on the top faces of the circuit patterns 33. The other end of the wires W is connected to electrodes on the front surface of the semiconductor elements 4 described later. Consequently, each of the circuit patterns 33 is electrically connected to the semiconductor elements 4.

The semiconductor elements 4 are formed having a rectangular shape in a plan view by a semiconductor substrate such as silicon (Si), silicon carbide (SiC), or gallium nitride (GaN), for example. The semiconductor elements 4 are configured as a reverse-conducting insulated-gate bipolar transistor (RC-IGBT) element combining the functions of an IGBT element and a free-wheeling diode (FWD) element, for example.

Note that the semiconductor elements 4 are not limited to the above, and may also be a switching element such as an IGBT, a power metal-oxide-semiconductor field-effect transistor (power MOSFET), or a bipolar junction transistor (BJT). Such semiconductor elements 4 are each provided with a positive electrode that acts as a main electrode on the back surface, and a gate electrode or the like that acts as a control electrode and a negative electrode that acts as a main electrode on the front surface, for example. Alternatively, the semiconductor elements 4 may be a diode element such as a Schottky barrier diode (SBD) or a P-intrinsic-N (PiN) diode. Such semiconductor elements 4 are each provided with a cathode that acts as a main electrode on the back surface and an anode that acts as a main electrode on the front surface. Also, an element such as a reverse-blocking IGBT (RB-IGBT) having a sufficient withstand voltage with respect to reverse bias may also be used as the semiconductor elements 4. Also, the semiconductor elements 4 may be connected to the above switching element by a wiring member such as the wire W inside the semiconductor module 1, and may be a control IC that controls the switching element. Properties such as the shape, number, and placement of the semiconductor elements 4 may be changed appropriately.

The case 5 is a rectangular frame following the outer shape of the base plate 2, and is a resin molded product in which a frame 51 that acts as an annular wall formed standing upright in the Z direction and a terminal block 52 formed extending inward from an inner wall surface 51a of the frame 51 are formed as a single piece. Terminals 7 are embedded in the case 5 by insert molding. One end of the terminals 7 extend outward from the frame 51 while the other end extends inward from the frame 51 and is secured to a top face 52a of the terminal block 52, with the intermediate part being embedded inside the case 5. The case 5 is formed using a resin material with excellent thermal resistance and chemical resistance. For example, a material including a polyphenylene sulfide (PPS) resin, a polybutylene terephthalate (PBT) resin, a polyoxymethylene (POM) resin, or a polyamide (PA) resin is used as the resin material. A filler such as ceramic may also be mixed into the case 5.

The case 5 is adhesively secured by an adhesive part 6 to the top face of the base plate 2, for example. In the first embodiment, the adhesive part 6 is formed using an epoxy adhesive containing an epoxy resin having good adhesion to an encapsulating resin 8 described later as a main agent. Note that a silicone adhesive may also be used instead of an epoxy adhesive as the adhesive part 6. Furthermore, a filler such as ceramic may also be mixed into the adhesive part 6.

In the first embodiment, the case 5 is formed surrounding three multilayer substrates 3. However, the case 5 is not limited to the above, and may also be formed surrounding a single multilayer substrate 3 or surrounding four or more multilayer substrates 3. Additionally, the case 5 may be a rectangular frame following the outer shape of the multilayer substrates 3 and may be adhesively secured by the adhesive part 6 to the top face of the multilayer substrates 3. At the very least, it is sufficient to form the case 5 surrounding the circuit patterns 33 formed in the multilayer substrates 3.

The terminal block 52 forms a step part that is a step down from the top face of the frame 51. The top face 52a of the terminal block 52 is formed at a lower position than the top face of the frame 51.

The plurality of terminals 7 are embedded by insert molding into the pair of opposing walls in the lateral direction (Y direction) of the frame 51. The terminals 7 are formed by bending a plate-like body of metal such as copper, a copper alloy, an aluminum alloy, or an iron alloy. The terminals 7 are not limited to being formed by bending a metal plate, and may also be a casting product. The surface of the terminals 7 may also be subjected to Ni plating to prevent corrosion and the like.

The terminals 7 have an inner terminal part 7A exposed on the top face 52a of the terminal block 52 and an outer terminal part 7B projecting out from the top face of the frame 51. More specifically, an intermediate part of the terminals 7 between the outer terminal part 7B and the inner terminal part 7A is embedded in the frame 51, with one end extending outward from the frame 51 as the outer terminal part 7B, and the other end extending inward from the frame 51 and secured to the top face 52a of the terminal block 52 as the inner terminal part 7A. Also, at least a portion of the back face and the side faces of the inner terminal part 7A is embedded in the top face 52a of the terminal block 52, thereby securing the inner terminal part 7A to the top face 52a of the terminal block 52.

One end (that is, the outer terminal part 7B) of the terminals 7 is electrically connected to external wiring (not illustrated) of the semiconductor module 1. The other end (that is, the inner terminal part 7A) of the terminals 7 is connected to one end of the wires W that act as wiring members by a bonding part S3. The other end of the wires W is connected to the electrodes of the semiconductor elements 4 on the multilayer substrates 3, the circuit patterns 33 bonded to the back electrodes of the semiconductor elements 4, the circuit patterns 33 connected to the semiconductor elements 4 through separate wiring members, or the like. In other words, the terminals 7 are electrically connected to components such as the semiconductor elements 4 on the multilayer substrates 3 by the wires W. For example, the terminals 7 may be control terminals for transmitting control signals to the semiconductor elements 4.

For the wires W, a wire rod of copper, aluminum, gold alloy, copper alloy, aluminum alloy or the like is used, for example. The diameter of the wires W is from 100 μm to 500 μm, for example. The wires W may also be replaced with a lead frame or a ribbon cord.

An encapsulating resin 8 fills the space prescribed by the base plate 2 and the frame 51. The space is filled until the surface of the encapsulating resin 8 is level with the top face of the frame 51, for example. The encapsulating resin 8 causes various components, including at least the circuit patterns 33 of the multilayer substrates 3, the electronic components (for example, the semiconductor elements 4) mounted thereon, the inner terminal part 7A of the terminals 7, and the wires W, to be encapsulated inside the space described above. In other words, the encapsulating resin 8 encapsulates the various components inside the case 5. Note that in FIG. 1, the encapsulating resin 8 is omitted from illustration for convenience.

The encapsulating resin 8 is formed using an epoxy resin, for example. Aliphatic epoxy or alicyclic epoxy is used as the main agent of the encapsulating resin 8, for example. A maleimide resin or a cyanate resin may also be mixed into the main agent of the encapsulating resin 8. The encapsulating resin 8 may also contain inorganic filler and other additives.

Thermal stress is concentrated near the interface between different materials due to differences in the physical properties (mainly differences in the coefficient of thermal expansion and differences in the elastic modulus) of the different materials. For example, if the semiconductor module 1 is subjected to a heat cycle test, thermal stress is concentrated near the interface between the case 5 and the encapsulating resin 8. The concentration of stress may cause peeling between the case 5 and the encapsulating resin 8. Typically, because the overall case 5 is bent so as to be raised upward (the direction indicated by the arrowhead of the Z direction), peeling occurs between the frame 51 and the encapsulating resin 8 at the interface near the top face of the frame 51. The peeling progresses downward and subsequently reaches the interface between the terminal block 52 and the encapsulating resin 8. If the peeling of the encapsulating resin 8 progresses as far as the terminal block 52 and a load is imposed on the bonding part S3 between the wires W and the terminals 7, the bonding part S3 may peel away from the terminals 7 or the wires W may break, and defects may occur in which the terminals 7 and the semiconductor elements 4 on the multilayer substrates 3 become electrically disconnected.

Accordingly, in the first embodiment, through-holes 54 that penetrate through the terminal block 52 are formed in the terminal block 52. An anchor effect provided by the through-holes 54 inhibits peeling between the case 5 and the encapsulating resin 8.

Specifically, the through-holes 54 are holes that penetrate from the top face 52a (first surface) of the terminal block 52 in contact with the encapsulating resin 8 to a bottom face 52b (second surface) of the terminal block 52 in contact with the adhesive part 6, with each through-hole 54 having one opening 54a in the top face 52a and an opposite opening 54b in the bottom face 52b. Internally, the through-holes 54 are filled with the encapsulating resin 8 from the one opening 54a and with an adhesive (the adhesive forming the adhesive part 6) from the opposite opening 54b.

In the first embodiment, an anchor effect is exhibited by the encapsulating resin 8 flowing into the through-holes 54 from the opening 54a and then being cured, and the strength of the bond between the case 5 and the encapsulating resin 8 is improved. For this reason, peeling between the case 5 and the encapsulating resin 8 caused by thermal stress is reduced. Consequently, peeling of the bonding part S3 from the terminals 7 or breakage of the wires W occurs less readily, and defects in which the terminals 7 and the semiconductor elements 4 on the multilayer substrates 3 become electrically disconnected are reduced. In addition, an anchor effect is exhibited by the adhesive flowing into the through-holes 54 and then being cured, and the strength of the bond between the case 5 and the adhesive part 6 is improved. For this reason, peeling between the case 5 and the adhesive part 6 caused by thermal stress is also reduced.

In the first embodiment, the encapsulating resin 8 that fills the through-holes 54 from the one opening 54a and the adhesive that fills the through-holes 54 from the opposite opening 54b may or may not contact each other inside the through-holes 54. As illustrated in FIG. 3, preferably, the encapsulating resin 8 and the adhesive contact each other inside the through-holes 54. In other words, the through-holes 54 are completely filled by the encapsulating resin 8 and the adhesive that have flowed inside and cured. More preferably, the encapsulating resin 8 and the adhesive contact each other inside the through-holes 54 such that one has a raised shape on the encapsulating resin 8 side and the other has a corresponding sunken shape. In the example of FIG. 3, the encapsulating resin 8 and the adhesive contact each other such that the adhesive has a raised shape on the encapsulating resin 8 side and the encapsulating resin 8 has a corresponding sunken shape. Also, in the first embodiment, a material containing an epoxy resin as a main agent is used for both the adhesive part 6 and the encapsulating resin 8 in order to improve the adhesion between the adhesive part 6 and the encapsulating resin 8 flowing into the through-holes 54. With this configuration, the anchor effect is strengthened even further at the openings 54a and 54b, enhancing the effect of inhibiting peeling between the case 5 and the encapsulating resin 8 as well as peeling between the case 5 and the adhesive part 6.

In the first embodiment, by improving not only the strength of the bond between the case 5 and the encapsulating resin 8 but also the strength of the bond between the case 5 and the adhesive part 6, the concentration of stress near the interface between the case 5 and the encapsulating resin 8 as well as the concentration of stress near the interface between the case 5 and the adhesive part 6 can be avoided. Consequently, the occurrence of peeling due to the concentration of stress either near the interface of the former or near the interface of the latter can be prevented.

As illustrated in FIGS. 1 to 4, in the Y direction, the through-holes 54 are positioned closer to the inner wall surface 51a of the frame 51 than the bonding part S3 between the terminals 7 and the wires W. The strength of the bond between the case 5 and the encapsulating resin 8 is improved particularly near the through-holes 54 that exhibit the anchor effect. For this reason, even if peeling between the frame 51 and the encapsulating resin 8 occurring near the top face of the frame 51 progresses to the terminal block 52, the progression is inhibited easily short of the bonding part S3 (for example, between the inner wall surface 51a and the through-holes 54). Consequently, peeling of the bonding part S3 from the terminals 7 or breakage of the wires W occurs less readily, and defects in which the terminals 7 and the semiconductor elements 4 on the multilayer substrates 3 become electrically disconnected are reduced.

As illustrated in FIGS. 1 and 4, the through-holes 54 are formed at positions neighboring the terminals 7 in a plan view. By forming the through-holes 54 at positions neighboring the terminals 7, the strength of the bond between the case 5 and the encapsulating resin 8 near the terminals 7 can be improved particularly. Consequently, peeling of the bonding part S3 from the terminals 7 and breakage of the wires W occurs much less easily.

As illustrated in FIGS. 1 and 4, the respective other ends (inner terminal parts 7A) of a plurality of terminals 7 are arranged side by side on the top face 52a of the terminal block 52, and a pair of the through-holes 54 is formed so as to flank the respective other ends (inner terminal parts 7A)

of the plurality of terminals 7. In the example of FIG. 4, a pair of the through-holes 54 is formed so as to flank five inner terminal parts 7A side by side in the lateral direction (X direction) of the top face 52a. The through-holes 54 are formed beside a portion of the terminals 7 among the plurality of terminals 7 in a plan view, but the present invention is not limited thereto and may be modified appropriately. The through-holes 54 may also be formed on both sides of all of the terminals 7, for example. By forming the through-holes 54 on both sides of all of the terminals 7, the strength of the bond between the case 5 and the encapsulating resin 8 can be improved even further, and peeling between the case 5 and the encapsulating resin 8 due to thermal stress can be inhibited even further.

The diameter of the through-holes 54 is a size suited to improving the strength of the bond between the case 5 and the encapsulating resin 8 by the anchor effect to inhibit peeling between the case 5 and the encapsulating resin 8 due to thermal stress. Specifically, the diameter of the through-holes 54 is 0.5 mm or greater, and less than 3.0 mm. Preferably, the diameter of the through-holes 54 is 0.5 mm or greater, and less than 1.5 mm. If the diameter of the through-holes 54 is small, the encapsulating resin 8 does not fill the through-holes 54 deeply, and the anchor effect is weakened. If the diameter of the through-holes 54 is large, the strength of the terminal block 52 is weakened and there is a possibility that cracks may occur or the bonding strength may be reduced when bonding the wires W.

In the first embodiment, the through-holes 54 are formed extending vertically downward from the top face 52a. Here, if a shear load and a tensile load are exerted between the case 5 and the encapsulating resin 8 due to thermal stress, a force is imparted to the encapsulating resin 8 that generally works to peel inwardly and obliquely upward (the direction of the arrow B in FIG. 2) from the frame 51 with respect to the case 5. Consequently, the through-holes 54 may also be formed extending obliquely downward from the top face 52a. For example, by forming the through-holes 54 extending in an oblique downward direction that is orthogonal or nearly orthogonal to the direction of the arrow B, an even greater anchor effect is exhibited with respect to the force working to peel in the direction of the arrow B, and peeling between the case 5 and the encapsulating resin 8 due to thermal stress is inhibited even further.

The through-holes 54 may also be replaced with non-penetrating holes formed extending vertically downward or obliquely downward to a predetermined depth from the top face 52a of the terminal block 52. In this case, the strength of the bond between the case 5 and the encapsulating resin 8 likewise is improved by the anchor effect.

The through-holes 54 have a circular shape in a plane orthogonal to the penetration direction (in the first embodiment, the Z direction), but the through-holes 54 according to the present invention are not limited thereto and may be modified appropriately. The shape of the through-holes 54 in a plane orthogonal to the penetration direction may also be elliptical or polygonal, and furthermore may be a more complex shape (for example, a star shape) to improve the anchor effect.

Second Embodiment

Figure 5:
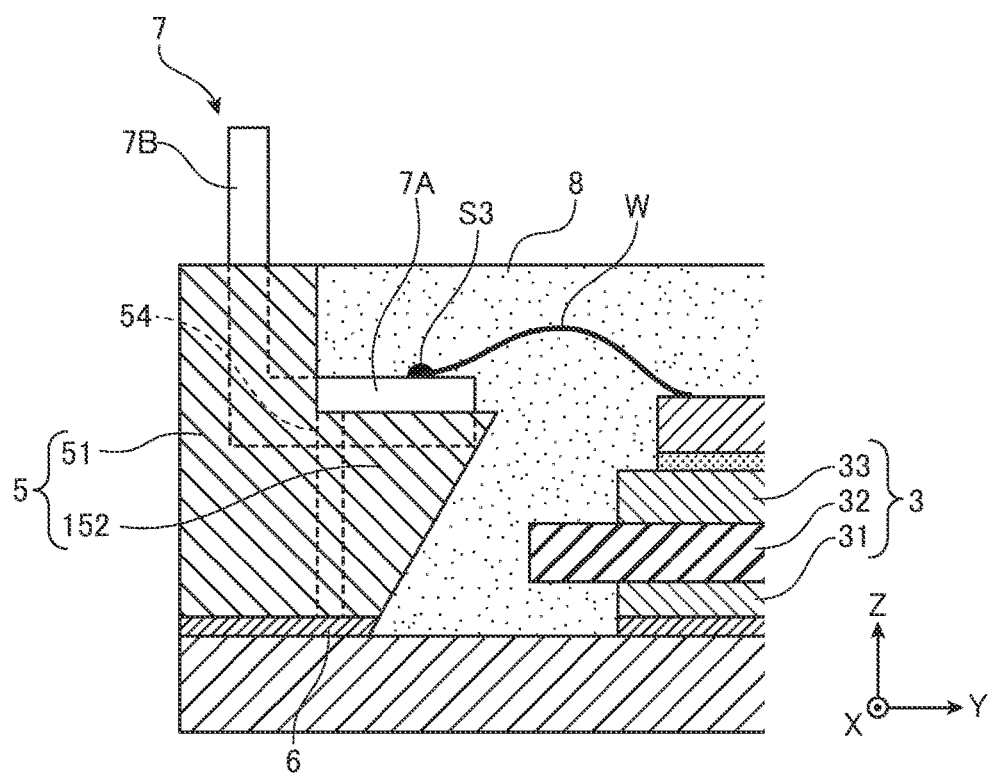
FIG. 5 is a diagram illustrating an internal structure of a semiconductor module according to a second embodiment of the present invention.

FIG. 5 is a diagram illustrating an internal structure of a semiconductor module according to a second embodiment of the present invention. FIG. 5 illustrates the internal structure of a terminal block 152 and the surrounding area.

The semiconductor module according to the second embodiment has the same configuration as the semiconductor module 1 according to the first embodiment, except that the shape of the terminal block 152 is different from the terminal block 52 of the first embodiment.

As illustrated in FIG. 5, the terminal block 152 is formed such that the amount of inward projection by the frame 51 gradually decreases from the upper part to the lower part of the terminal block 152. By forming the terminal block 152 to have such a shape, the space between the multilayer substrates 3 and the terminal block (mainly the space in the Y direction) is expanded compared to the first embodiment. With this expansion of space, an insulating plate 32 having a larger area compared to the first embodiment can be disposed, for example. By disposing an insulating plate 32 having a larger area, the area available for mounting electronic components increases, thereby making it possible to mount more electronic components or mount bigger electronic components with excellent thermal durability.

As illustrated in FIG. 5, the terminal block 152 is wedge-shaped in a YZ cross section. In the second embodiment, the anchor effect is exhibited and the strength of the bond between the case 5 and the encapsulating resin 8 is also improved by the wedge shape.

Third Embodiment

Figure 6:
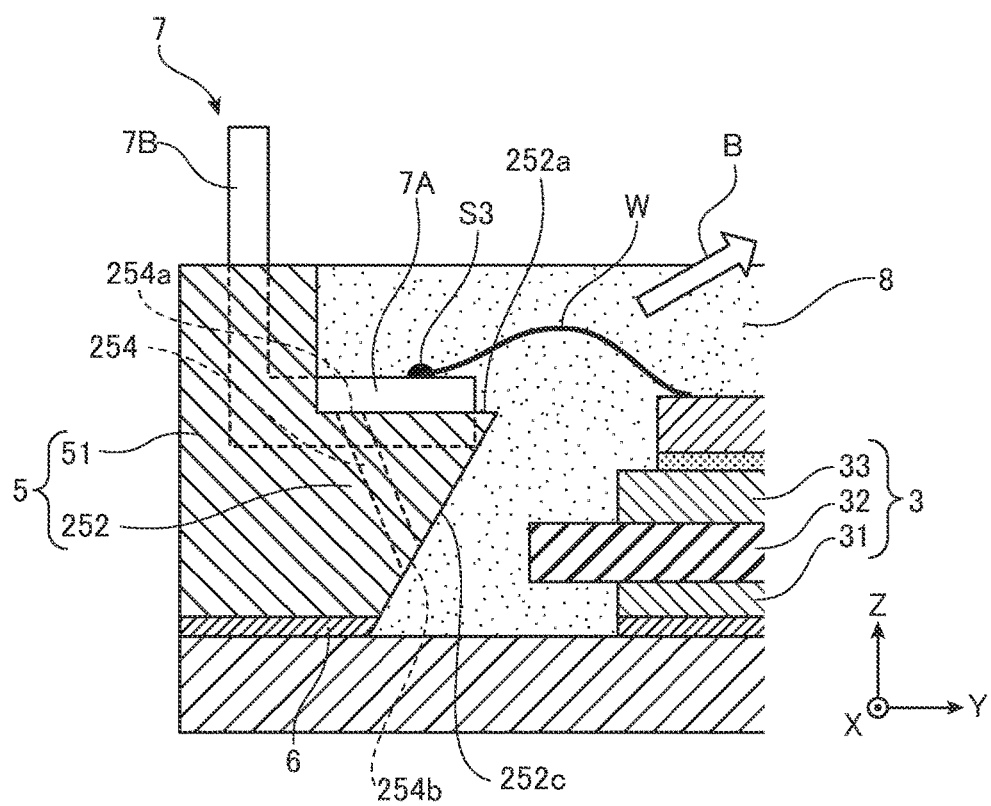
FIG. 6 is a diagram illustrating an internal structure of a semiconductor module according to a third embodiment of the present invention.

FIG. 6 is a diagram illustrating an internal structure of a semiconductor module according to a third embodiment of the present invention. FIG. 6 illustrates the internal structure of a terminal block 252 and the surrounding area.

In the terminal block 252, through-holes 254 are formed extending obliquely downward with respect to a top face 252a. The semiconductor module according to the third embodiment has the same configuration as the semiconductor module according to the second embodiment, except that the through-holes 254 are formed extending obliquely downward with respect to the top face 252a, and openings 254b of the through-holes 254 are formed in a face 252c of the terminal block 252 facing the multilayer substrates 3.

In the third embodiment, the through-holes 254 are formed extending in an oblique direction orthogonal to or nearly orthogonal to the direction of the arrow B. Consequently, an even greater anchor effect is exhibited with respect to the force working to peel in the direction of the arrow B, and peeling between the case 5 and the encapsulating resin 8 due to thermal stress is inhibited even further.

In the third embodiment, the encapsulating resin 8 flows into the through-holes 254 from not only openings 254a but also openings 254b and is cured. The interior of the through-holes 254 is completely filled by the encapsulating resin 8 that has flowed in from both openings and cured. Consequently, an even greater anchor effect is exhibited, and peeling between the case 5 and the encapsulating resin 8 due to thermal stress is inhibited even further.

[Evaluation]

A heat cycle test was performed on the semiconductor modules according to the first embodiment (FIGS. 1 to 4), the second embodiment (FIG. 5), the third embodiment (FIG. 6), the fourth embodiment (FIGS. 1 to 4), and a comparative example. The heat cycle test that was performed was a liquid bath test in which a low-temperature bath and a high-temperature bath were set to −40° C. and 125° C., respectively. During the heat cycle test, electrical continuity through the wires W was confirmed to exist or not every 500 cycles. Note that the semiconductor module according to the comparative example has the same configuration as the semiconductor module 1 according to the first embodiment, except that the through-holes 54 are not formed in the terminal block 52.

For the multilayer substrates 3 of the semiconductor modules according to each of the first to third embodiments and the semiconductor module according to the comparative example, a substrate obtained by stacking a copper metal plate 31 with a thickness of 0.3 mm, the circuit patterns 33, and a silicon nitride insulating plate 32 with a thickness of 0.32 mm was used. On top of the multilayer substrates 3, semiconductor elements 4 (silicon IGBT elements) and a copper lead frame (not illustrated) acting as a main terminal were soldered using an N2 reflow oven. Next, the multilayer substrates 3 were soldered onto the base plate 2 (an aluminum cooler) using an N2 reflow oven. Next, a silicone adhesive (TSE322 (manufactured by Momentive)) was used to stick the case 5 (PPS resin) containing the terminals 7 formed by insert molding onto the base plate 2. The through-holes 54 having a diameter of 1 mm were formed in the case 5. Note that the adhesive part 6 is formed by the curing of the silicone adhesive. Next, control pads of the semiconductor elements 4 and the terminals 7 were electrically connected by wires W (aluminum) having a diameter of 300 μm. Next, an aliphatic epoxy resin main agent (jER® 630 (manufactured by Mitsubishi Chemical)), a curing agent (jER Cure® 113 (manufactured by Mitsubishi Chemical)), and an inorganic filler (Excelica®, average grain size: several micrometers to several dozen micrometers (manufactured by Tokuyama Corporation)) were mixed in a ratio of 10:5:3 by weight and then subjected to vacuum defoaming to obtain the encapsulating resin 8, which was used to fill the space prescribed by the base plate 2 and the frame 51. The encapsulating resin 8 was subjected to a primary curing at 100° C. for one hour, followed by a secondary curing at 150° C. for three hours.

The semiconductor module according to the fourth embodiment is the same as the semiconductor module 1 according to the first embodiment, except that an epoxy resin (CV5350AS (manufactured by Panasonic)) was used as the material of the adhesive part 6.

The following lists the numbers of cycles at which electrical continuity through the wires W was lost in each of the semiconductor modules according to the first to fourth embodiments and the semiconductor module according to the comparative example.

First embodiment: 1500 cycles
Second embodiment: 1500 cycles
Third embodiment: 2000 cycles
Fourth embodiment: 2000 cycles
Comparative example: 1000 cycles As described above, in the semiconductor module according to the comparative example in which through-holes for exhibiting an anchor effect are not formed in the terminal block, electrical continuity through the wires W is lost after at most 1000 cycles, whereas in each of the semiconductor modules according to the first to fourth embodiments in which through-holes for exhibiting an anchor effect are formed in the terminal block, electrical continuity through the wires W is secured up to a number of cycles at least exceeding 1000 cycles. These results demonstrate that forming through-holes in the terminal block increases the number of cycles until the encapsulating resin 8 peels, and inhibits defects in which the electrical connections between the terminals 7 and the semiconductor elements 4 on the multilayer substrates 3 are broken.

Also, in the fourth embodiment, by forming the adhesive part 6 using a material containing an epoxy resin like the encapsulating resin 8 as a main agent, the adhesion between the adhesive part 6 and the encapsulating resin 8 is improved compared to the first embodiment. Through the improvement of the adhesion, the encapsulating resin 8 is strongly secured inside the through-holes 54 and the strength of the bond between the case 5 and the encapsulating resin 8 is improved compared to the first embodiment, thereby demonstrating that peeling between the case 5 and the encapsulating resin 8 occurs less easily.

Next, semiconductor modules according to Modifications 1 to 5 of the present invention will be described. In the following, Modifications 1 to 5 are described as modifications of the first embodiment, but the configurations of Modifications 1 to 5 are also applicable to any of the second to fourth embodiments.

[Modification 1]

Figure 7:
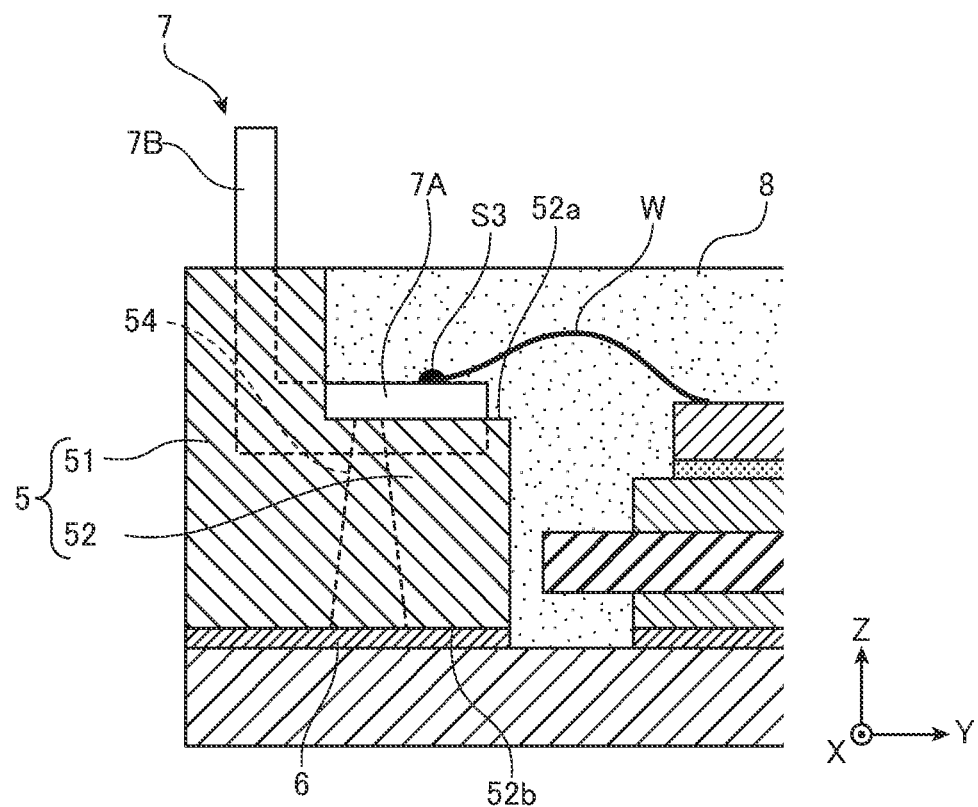
FIG. 7 is a diagram illustrating an internal structure of a semiconductor module according to Modification 1 of the first embodiment of the present invention.

FIG. 7 is a diagram illustrating an internal structure of a semiconductor module according to Modification 1 of the first embodiment of the present invention. FIG. 7 illustrates the internal structure of the terminal block 52 and the surrounding area.

As illustrated in FIG. 7, the through-holes 54 according to Modification 1 are tapered such that the inside diameter gradually increases from the top face 52a of the terminal block 52 to the lower part (bottom face 52b). By forming the through-holes 54 in such a shape, when a load is exerted between the case 5 and the encapsulating resin 8 due to thermal stress, the encapsulating resin 8 filling the interior of the through-holes 54 digs into the inner wall surface of the through-holes 54 like a wedge. Consequently, an even greater anchor effect is exhibited.

[Modification 2]

Figure 8:
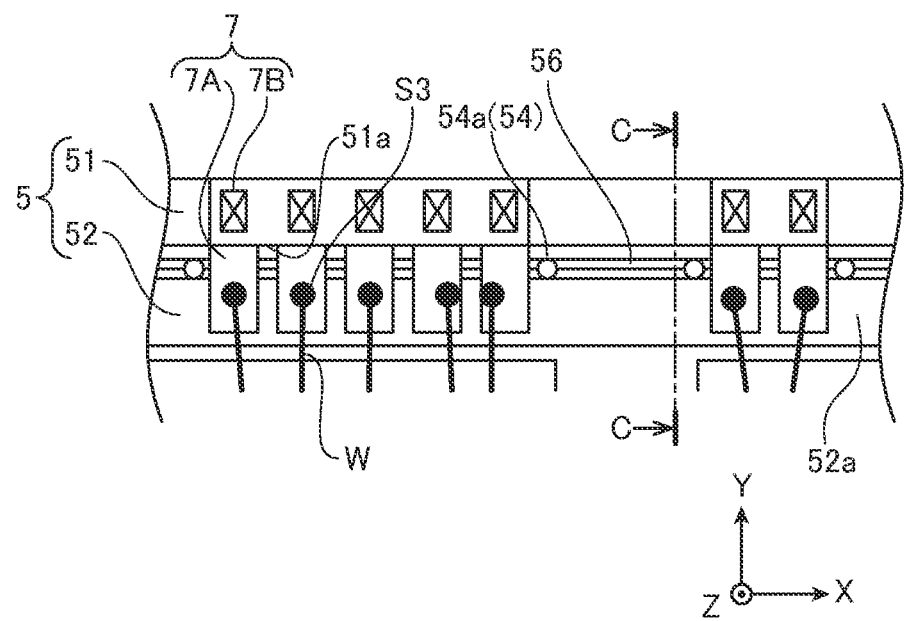
FIG. 8 is a plan view illustrating a portion of a semiconductor module according to Modification 2 of the first embodiment of the present invention.
Figure 9:
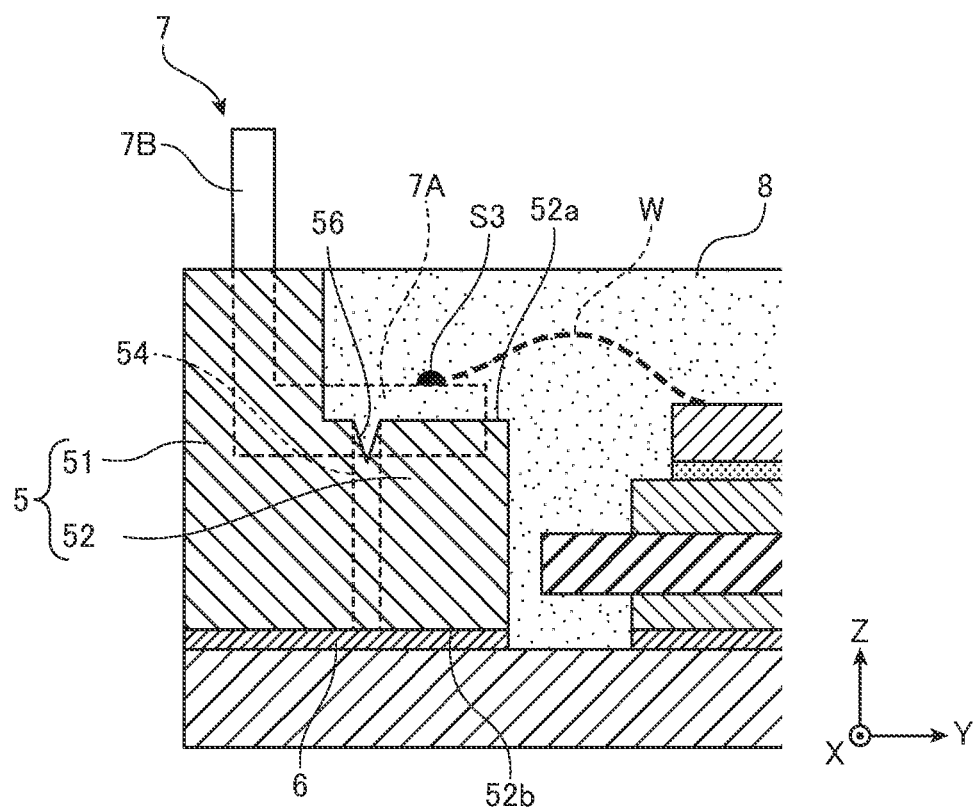
FIG. 9 is a plan view illustrating an internal structure of a semiconductor module according to Modification 2 of the first embodiment of the present invention.

FIG. 8 is a plan view illustrating a portion of a semiconductor module according to Modification 2 of the first embodiment of the present invention. FIG. 9 is a cross section view taken along the line C-C in FIG. 8, illustrating an internal structure of the semiconductor module according to Modification 2.

In Modification 2, as illustrated in FIGS. 8 and 9, a recess 56 is formed in the top face 52a of the terminal block 52. The recess 56 is a V-shaped groove formed along the entire length in the X direction of the terminal block 52 for example, and is filled with the encapsulating resin 8. In the Y direction, the recess 56 is positioned closer to the inner wall surface 51a of the frame 51 than the bonding part S3 between the terminals 7 and the wires W. More specifically, in the Y direction, the recess 56 is formed at the same position as the openings 54a of the through-holes 54. Furthermore, the openings 54a are formed inside the recess 56. In other words, the through-holes 54 and the recess 56 communicate, and the through-holes 54 are holes that penetrate from the recess 56 to the bottom face 52b of the terminal block 52.

Because of the anchor effect exhibited by the encapsulating resin 8 flowing into the recess 56 and curing, even in the case where peeling between the frame 51 and the encapsulating resin 8 occurring at the interface near the top face of the frame 51 progresses as far as the terminal block 52, the progression is inhibited easily short of the bonding part S3 (for example, between the inner wall surface 51a and the through-holes 54 as well as the recess 56 in FIGS. 8 and 9).

[Modification 3]

Figure 10:
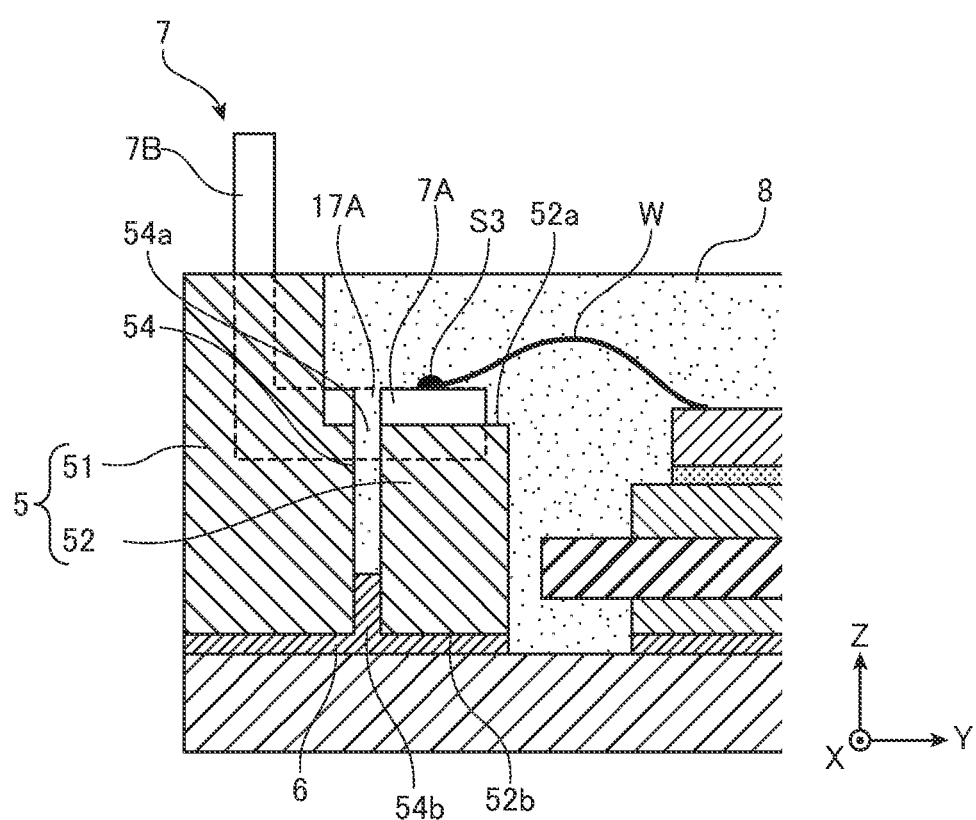
FIG. 10 is a diagram illustrating an internal structure of a semiconductor module according to Modification 3 of the first embodiment of the present invention.
Figure 11:
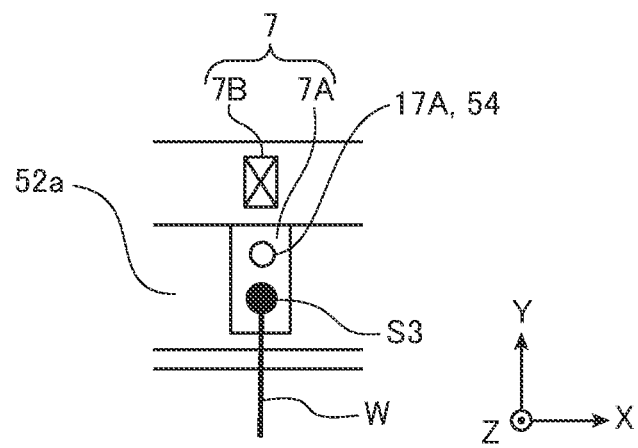
FIG. 11 is a plan view illustrating a terminal and the area surrounding the terminal provided in the semiconductor module according to Modification 3 of the first embodiment of the present invention.

FIG. 10 is a diagram illustrating an internal structure of a semiconductor module according to Modification 3 of the first embodiment of the present invention. FIG. 10 illustrates the internal structure of the terminal block 52 and the surrounding area. FIG. 11 is a plan view illustrating one of the terminals 7 and the area surrounding the terminal 7 provided in the semiconductor module according to Modification 3.

In Modification 3, as illustrated in FIGS. 10 and 11, a through-hole 17A is formed in the inner terminal part 7A exposed on the top face 52a of the terminal block 52. It is sufficient for each through-hole 54 to overlap and communicate at least partially with the through-hole 17A in a plan view. Each through-hole 54 is positioned directly below the through-hole 17A. In the example of FIGS. 10 and 11, the through-hole 54 and the through-hole 17A are concentric holes of equal diameter that form a continuous passage. The passage formed by the through-hole 54 and the through-hole 17A is filled with the encapsulating resin 8. Consequently, an even greater anchor effect is obtained compared to a configuration in which the through-hole 17a is not formed in the inner terminal part 7A.

[Modification 4]

Figure 12:
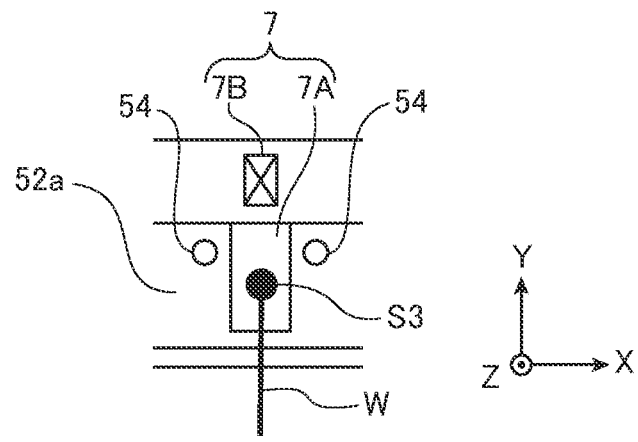
FIG. 12 is a plan view illustrating a terminal and the area surrounding the terminal provided in the semiconductor module according to Modification 4 of the first embodiment of the present invention.

FIG. 12 is a plan view illustrating one of the terminals 7 and the area surrounding the terminal 7 provided in the semiconductor module according to Modification 4 of the first embodiment of the present invention. As illustrated in FIG. 12, in Modification 4, a pair of through-holes 54 are formed so as to flank the other end (inner terminal part 7A) of a terminal 7 disposed on the top face 52a of the terminal block 52. More specifically, a pair of through-holes 54 are formed on both sides of the other end (inner terminal part 7A) so as to flank the other end of some or all of the plurality of terminals 7 disposed on the top face 52a of the terminal block 52. The strength of the bond between the case 5 and the encapsulating resin 8 is improved near the inner terminal part 7A positioned between the pair of through-holes 54, and therefore peeling of the bonding part S3 from the inner terminal part 7A or breakage of the wires W near the inner terminal part 7A occurs less easily, and defects in which the terminals 7 and the semiconductor elements 4 on the multilayer substrates 3 become electrically disconnected are reduced.

[Modification 5]

The semiconductor module according to Modification 5 has the same configuration as the semiconductor module 1 according to the first embodiment, except that non-penetrating holes are formed in the terminal block 52 instead of the through-holes 54. The non-penetrating holes are formed partway from the top face 52a of the terminal block 52 and stop partway through, without penetrating through the terminal block 52. In other words, the non-penetrating holes are pit-shaped.

By forming the non-penetrating holes in such a shape, the encapsulating resin 8 fills the non-penetrating holes more easily compared to the first embodiment. Consequently, the manufacturing process can be simplified. Through such non-penetrating holes, an anchor effect is likewise exhibited with respect to the force working to peel in the direction of the arrow B, and peeling between the case 5 and the encapsulating resin 8 due to thermal stress is inhibited. Moreover, in the Y direction, the non-penetrating holes are positioned closer to the inner wall surface 51a of the frame 51 than the bonding part S3 between the terminals 7 and the wires W. For this reason, even if peeling between the frame 51 and the encapsulating resin 8 occurring near the top face of the frame 51 progresses to the terminal block 52, the progression is inhibited short of the bonding part S3. Consequently, peeling of the bonding part S3 from the terminals 7 or breakage of the wires W occurs less readily, and defects in which the terminals 7 and the semiconductor elements 4 on the multilayer substrates 3 become electrically disconnected are reduced.

The foregoing describes exemplary embodiments and modifications, but the above embodiments and modifications may also be combined in full or in part and treated as another embodiment.

Also, an embodiment is not limited to the embodiments and modifications described above, and various alterations, substitutions, and modifications are possible without departing from the scope of the technical idea. Further, if the technical idea can be achieved according to another method through the advancement of the technology or another derivative technology, the technical idea may be implemented using the method. Consequently, the claims cover all embodiments which may be included in the scope of the technical idea.

Features of the above embodiments are summarized below.

A semiconductor module according to the foregoing embodiments is provided with: a case having a frame that surrounds a substrate and a terminal block formed extending inward from an inner wall surface of the frame; a terminal having one end extending outward from the frame and another end extending inward from the frame and secured to a top face of the terminal block; a wiring member that electrically connects the terminal and a semiconductor element on the substrate; and an encapsulating resin that encapsulates the other end of the terminal, the wiring member, and the semiconductor element inside the case, wherein a hole is formed in the top face of the terminal block, and the hole is filled with the encapsulating resin, and is positioned closer to the inner wall surface of the frame than a bonding part between the terminal and the wiring member.

Also, in the semiconductor module according to the foregoing embodiments, the hole penetrates through the terminal block.

Also, in the semiconductor module according to the foregoing embodiments, the hole is formed extending in an orthogonal or oblique direction with respect to the top face of the terminal block.

Also, in the semiconductor module according to the foregoing embodiments, the hole is tapered such that a diameter of the hole increases from the top face of the terminal block downward.

Also, in the semiconductor module according to the foregoing embodiments, a recess is formed in the top face of the terminal block, and the recess is filled with the encapsulating resin, and is positioned closer to the inner wall surface of the frame than the bonding part.

Also, a semiconductor module according to the foregoing embodiments is provided with: a case having a frame that surrounds a substrate and a terminal block formed extending inward from an inner wall surface of the frame; a terminal having one end extending outward from the frame and another end extending inward from the frame and secured to a top face of the terminal block; a wiring member that electrically connects the terminal and a semiconductor element on the substrate; an encapsulating resin that encapsulates the other end of the terminal, the wiring member, and the semiconductor element inside the case; and an adhesive part that sticks the frame to a base with an adhesive, wherein a hole is formed in the terminal block so as to penetrate from a first surface of the terminal block in contact with the encapsulating resin to a second surface of the terminal block in contact with the adhesive part, and the hole has one opening in the first surface, has an opposite opening in the second surface, and is filled with the encapsulating resin from the one opening and is filled with the adhesive from the opposite opening.

Also, in the semiconductor module according to the foregoing embodiments, the encapsulating resin and the adhesive contact each other inside the hole.

Also, in the semiconductor module according to the foregoing embodiments, the first surface is the top face of the terminal block in contact with the encapsulating resin, and the second surface is a bottom face of the terminal block in contact with the adhesive part.

Also, in the semiconductor module according to the foregoing embodiments, the hole is formed extending in an orthogonal or oblique direction with respect to the first surface.

Also, in the semiconductor module according to the foregoing embodiments, the hole is tapered such that a diameter of the hole increases from the one opening to the opposite opening.

Also, in the semiconductor module according to the foregoing embodiments, a recess is formed in the first surface, and the recess is filled with the encapsulating resin.

Also, in the semiconductor module according to the foregoing embodiments, the encapsulating resin and the adhesive part are formed using an epoxy resin.

Also, in the semiconductor module according to the foregoing embodiments, the hole is positioned closer to the inner wall surface of the frame than a bonding part between the terminal and the wiring member.

Also, in the semiconductor module according to the foregoing embodiments, in the terminal block, an amount of inward projection by the frame gradually decreases from an upper part to a lower part of the terminal block.

Also, in the semiconductor module according to the foregoing embodiments, the diameter of the hole is 0.5 mm or greater, and less than 3.0 mm. Preferably, the diameter of the through-holes 54 is 0.5 mm or greater, and less than 1.5 mm.

Also, in the semiconductor module according to the foregoing embodiments, the frame and the terminal block are a resin molded product formed as a single piece.

Also, in the semiconductor module according to the foregoing embodiments, the other ends of a plurality of terminals are disposed side by side on the top face of the terminal block, and a pair of the holes are formed so as to flank the other ends of the plurality of terminals.

Also, in the semiconductor module according to the foregoing embodiments, a pair of the holes are formed so as to flank the other end of one terminal disposed on the top face of the terminal block.

Also, in the semiconductor module according to the foregoing embodiments, the hole is positioned underneath the terminal, a through-hole concentric with the hole formed underneath is formed in the terminal, and the through-hole formed in the terminal and the hole formed underneath the terminal are filled with the encapsulating resin.

Also, in the semiconductor module according to the foregoing embodiments, the wiring member is a wire.

As described above, the present invention has an effect of reducing the occurrence of defects in which the electrical connections between the terminals and the semiconductor elements on the substrate are disconnected due to peeling of the encapsulating resin, and is particularly useful in a semiconductor module.

REFERENCE SIGNS LIST

1: semiconductor module
2: base plate
3: multilayer substrate
4: semiconductor element
5: case
6: adhesive part
7: terminal
7A: inner terminal part
7B: outer terminal part
8: encapsulating resin
17A: through-hole
31: metal plate
32: insulating plate
33: circuit pattern
51: frame
51a: inner wall surface
52: terminal block
52a: top face
52b: bottom face
54: through-hole
54a: opening
54b: opening
56: recess
152: terminal block
252: terminal block
252a: top face
252c: face
254: through-hole
254a: opening
254b: opening

What is claimed is:

1. A semiconductor module, comprising:
   a substrate having a semiconductor element thereon;
   a case having a frame that surrounds the substrate and a terminal block extending inward from an inner wall surface of the frame toward the semiconductor element;
   a terminal having one end extending outward from the frame, and an other end extending inward from the frame and being secured to a top face of the terminal block;
   a wiring member that electrically connects the terminal and the semiconductor element on the substrate; and
   an encapsulating resin that encapsulates the other end of the terminal, the wiring member, and the semiconductor element inside the case, wherein
   the terminal block has a hole in the top face thereof, and
   the hole is filled with the encapsulating resin, and is positioned closer to the inner wall surface of the frame than is a bonding part between the terminal and the wiring member.

2. The semiconductor module according to claim 1, wherein the hole penetrates through the terminal block.

3. The semiconductor module according to claim 1, wherein
   the hole extends in a direction orthogonal or oblique to the top face of the terminal block.

4. The semiconductor module according to claim 1, wherein
   the hole is tapered such that a diameter of the hole increases from the top face of the terminal block downward.

5. The semiconductor module according to claim 1, wherein
   the terminal block also has a recess in the top face thereof overlapping the hole, and
   the recess is filled with the encapsulating resin, and is positioned closer to the inner wall surface of the frame than is the bonding part.

6. The semiconductor module according to claim 1, wherein in the terminal block, an amount of inward projection by the frame gradually decreases from an upper part to a lower part of the terminal block.

7. The semiconductor module according claim 1, wherein the diameter of the hole is in a range of 0.5 mm to 3.0 mm.

8. The semiconductor module according to claim 1, wherein the frame and the terminal block are a resin molded product formed as a single piece.

9. The semiconductor module according to claim 1, wherein
the terminal is provided in plurality, and the other ends of the plurality of the terminals are disposed side by side on the top face of the terminal block, and
the hole is provided in plurality, and two of the holes sandwich the other ends of the plurality of terminals in a plan view of the semiconductor module.

10. The semiconductor module according to claim 1, wherein
the hole is provided in plurality, and two of the holes sandwich the other end of the terminal that is secured to the top face of the terminal block.

11. The semiconductor module according to claim 1, wherein
the hole of the terminal block is positioned underneath the terminal,
the terminal also has a through-hole concentric with the hole of the terminal block, and
the through-hole formed in the terminal and the hole formed underneath the terminal are filled with the encapsulating resin.

12. The semiconductor module according to claim 1, wherein the wiring member is a wire.

13. A semiconductor module, comprising:
a substrate having a semiconductor element thereon;
a case having a frame that surrounds the substrate and a terminal block formed extending inward from an inner wall surface of the frame;
a terminal having one end extending outward from the frame, and an other end extending inward from the frame and being secured to a top face of the terminal block;
a wiring member that electrically connects the terminal and the semiconductor element on the substrate; and
an encapsulating resin that encapsulates the other end of the terminal, the wiring member, and the semiconductor element inside the case;
a base on which the case is disposed; and
an adhesive that sticks the frame to the base, wherein
the terminal block has a hole formed therein so as to penetrate through from a first surface of the terminal block in contact with the encapsulating resin to a second surface of the terminal block in contact with the adhesive, and
the hole
opens at one end into the first surface of the terminal block, and at an opposite end into the second surface of the terminal block, and
is filled with the encapsulating resin from the one end and is filled with the adhesive from the opposite end.

14. The semiconductor module according to claim 13, wherein
the encapsulating resin and the adhesive contact each other inside the hole.

15. The semiconductor module according to claim 13, wherein
the first surface is the top face of the terminal block in contact with the encapsulating resin, and
the second surface is a bottom face of the terminal block in contact with the adhesive.

16. The semiconductor module according to claim 13, wherein
the hole extends in a direction orthogonal or oblique to the first surface.

17. The semiconductor module according to claim 13, wherein
the hole is tapered such that a diameter of the hole increases from the one end to the opposite end.

18. The semiconductor module according to claim 13, wherein
the terminal block also has a recess in the first surface thereof overlapping the hole, and
the recess is filled with the encapsulating resin.

19. The semiconductor module according to claim 13, wherein the encapsulating resin and the adhesive each contain an epoxy resin.

20. The semiconductor module according to claim 13, wherein
the hole is positioned closer to the inner wall surface of the frame than to a bonding part between the terminal and the wiring member.

\* \* \* \* \*